(12) United States Patent
Eng et al.

(10) Patent No.: US 12,727,193 B2
(45) Date of Patent: Sep. 1, 2026

(54) FinFET LDMOS DEVICE

(71) Applicant: UNITED MICROELECTRONICS CORP., Hsin-Chu City (TW)

(72) Inventors: Yi Chuen Eng, Tainan City (TW); Tzu-Feng Chang, Tainan City (TW); Teng-Chuan Hu, Tainan City (TW); Yi-Wen Chen, Tainan City (TW); Yu-Hsiang Lin, New Taipei City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 370 days.

(21) Appl. No.: 18/531,668

(22) Filed: Dec. 6, 2023

(65) Prior Publication Data

US 2025/0151320 A1 May 8, 2025

(30) Foreign Application Priority Data

Nov. 6, 2023 (TW) ................................ 112142610

(51) Int. Cl.
*H10D 30/65* (2025.01)
*H10D 30/62* (2025.01)

(52) U.S. Cl.
CPC ......... *H10D 30/65* (2025.01); *H10D 30/6211* (2025.01)

(58) Field of Classification Search
CPC .. H10D 30/65; H10D 30/6211; H10D 64/111; H10D 62/116; H10D 30/603; H10D 62/117
See application file for complete search history.

(56) References Cited

U.S. PATENT DOCUMENTS 7,719,064 B2 5/2010 Wu
9,640,663 B2 * 5/2017 Chen .................. H10D 30/0289
2008/0191291 A1 * 8/2008 Wu ........................ H10D 30/65 257/E29.007
2016/0141420 A1 * 5/2016 Chen .................. H10D 30/0289 438/283
2016/0149030 A1 * 5/2016 Kim ..................... H10D 84/834 257/401
2016/0181358 A1 * 6/2016 Zhang .................. H10D 62/109 438/283

(Continued)

FOREIGN PATENT DOCUMENTS

EP 4152371 A1 * 3/2023 ......... H10D 84/0158

*Primary Examiner* — Mohammed Shamsuzzaman
(74) *Attorney, Agent, or Firm* — Winston Hsu

(57) ABSTRACT

A FinFET LDMOS device includes a semiconductor substrate; juxtaposed first well and second well in the semiconductor substrate; semiconductor fins extending on the semiconductor substrate along a first direction, the semiconductor fins including a first fin portion in the first well and a second fin portion in the second well; an extra semiconductor body adjoining the first fin portion and the second fin portion and extending along a second direction; a source region on the first fin portion; a drain region on the second fin portion; a gate covering the semiconductor fin and extending along the second direction, wherein the gate partially overlaps the first fin portion and partially overlaps the second fin portion, and the extra semiconductor body is covered by the gate; and a single-diffusion break structure embedded in the second fin portion and between the gate and drain region.

16 Claims, 2 Drawing Sheets

(56) References Cited

U.S. PATENT DOCUMENTS

| | | | | |
|---|---|---|---|---|
| 2017/0243977 | A1* | 8/2017 | Lin ...................... | H10D 64/518 |
| 2018/0108755 | A1* | 4/2018 | Liu ...................... | H10D 30/024 |
| 2019/0131402 | A1* | 5/2019 | Liu ...................... | H10D 62/307 |
| 2022/0302172 | A1* | 9/2022 | Hong ................. | H10D 30/6735 |

* cited by examiner

FinFET LDMOS DEVICE

BACKGROUND OF THE INVENTION

1. Field of the Invention

The present invention relates to the field of semiconductor technology, and in particular to an improved fin field effect transistor laterally diffused metal oxide semiconductor (FinFET LDMOS) device.

2. Description of the Prior Art

FinFET devices have significantly faster switching times and higher current density than planar complementary metal-oxide-semiconductor (CMOS) technology.

Bulk FinFETs with lateral double-diffused MOS (LDMOS) structures, which are mostly used in RF power amplifiers, can provide a high breakdown voltage (e.g., between drain and source terminals). The high breakdown voltage is achieved, for example, by a charge carrier (e.g., electron) flow path that passes through a depletion region.

Due to the significant advancement of system-on-chip (SoC) based architectures in IC technology, FinFET-based laterally diffused MOS (LDMOS) FETs are crucial for integrating high-voltage (HV) devices with low-voltage (LV) FinFET-based digital systems.

SUMMARY OF THE INVENTION

It is one object of the present invention to provide an improved fin field effect transistor laterally diffused metal oxide semiconductor (FinFET LDMOS) device to solve the deficiencies or shortcomings of the existing technology.

One aspect of the invention provides a FinFET LDMOS device including a semiconductor substrate of a first conductivity type; a first well of the first conductivity type in the semiconductor substrate; a second well of a second conductivity type, juxtaposed with the first well of the first conductivity, in the semiconductor substrate; a semiconductor fin disposed on the semiconductor substrate and extending along a first direction, wherein the semiconductor fin comprises a first fin portion within the first well of the first conductivity type and a second fin portion within the second well of the second conductivity type; an extra semiconductor body adjoining the semiconductor fin and extending along a second direction orthogonal to the first direction, wherein the extra semiconductor body is in direct contact with the first fin portion and the second fin portion; a source region of the second conductivity type in the first fin portion; a drain region of the second conductivity type in the second fin portion; a gate overlying the semiconductor fin and extending along the second direction, wherein the gate partially overlaps with the first fin portion and partially overlaps with the second fin portion, wherein the extra semiconductor body is covered by the gate; and a single-diffusion break (SDB) structure embedded in the second fin portion and positioned between the gate and the drain region.

According to some embodiments, the first fin portion comprises a channel region between the source region and the SDB structure, wherein the channel region is disposed directly under the gate.

According to some embodiments, the second fin portion comprises a drift region in the second well of the second conductivity type between the channel region and the SDB structure, wherein the gate partially overlaps with the drift region.

According to some embodiments, the SDB structure comprises a bottom insulating layer and a top dummy gate disposed directly on the bottom insulating layer, wherein the top dummy gate is spaced apart from the gate, wherein the top dummy gate extends along the second direction, wherein the bottom insulating layer comprises silicon oxide, and wherein the top dummy gate and the gate are metal gates.

According to some embodiments, the SDB structure is contiguous with the drain region.

According to some embodiments, a top surface of the extra semiconductor body is lower than a top surface of the semiconductor fin.

According to some embodiments, the FinFET LDMOS device further includes a first epitaxial layer disposed on the source region; and a second epitaxial layer disposed on the drain region.

According to some embodiments, the first epitaxial layer and the second epitaxial layer comprise SiP.

According to some embodiments, the first conductivity type is P type and the second conductivity type is N type.

According to some embodiments, the semiconductor substrate is a silicon substrate, the first well of the first conductivity type is P well, the second well of the second conductivity type is N well, the source region of the second conductivity type is $N^+$ doped region, and the drain region of the second conductivity type is $N^+$ doped region.

Another aspect of the invention provides a FinFET LDMOS device including a semiconductor substrate of a first conductivity type; a first well of the first conductivity type in the semiconductor substrate; a second well of a second conductivity type, juxtaposed with the first well of the first conductivity, in the semiconductor substrate; a semiconductor fin disposed on the semiconductor substrate and extending along a first direction, wherein the semiconductor fin comprises a first fin portion within the first well of the first conductivity type and a second fin portion within the second well of the second conductivity type; an extra semiconductor body adjoining the semiconductor fin and extending along a second direction orthogonal to the first direction, wherein the extra semiconductor body is in direct contact with the first fin portion; a source region of the second conductivity type in the first fin portion; a drain region of the second conductivity type in the second fin portion; a gate overlying the semiconductor fin and extending along the second direction, wherein the gate partially overlaps with the first fin portion and partially overlaps with the second fin portion, wherein the extra semiconductor body is covered by the gate; and a single-diffusion break (SDB) structure embedded in the second fin portion and positioned between the gate and the drain region.

According to some embodiments, the first fin portion comprises a channel region between the source region and the SDB structure, wherein the channel region is disposed directly under the gate.

According to some embodiments, the second fin portion comprises a drift region in the second well of the second conductivity type between the channel region and the SDB structure, wherein the gate partially overlaps with the drift region.

According to some embodiments, the SDB structure comprises a bottom insulating layer and a top dummy gate disposed directly on the bottom insulating layer, wherein the top dummy gate is spaced apart from the gate, wherein the top dummy gate extends along the second direction, wherein the bottom insulating layer comprises silicon oxide, and wherein the top dummy gate and the gate are metal gates.

According to some embodiments, the SDB structure is contiguous with the drain region.

According to some embodiments, a top surface of the extra semiconductor body is lower than a top surface of the semiconductor fin.

According to some embodiments, the FinFET LDMOS device further includes a first epitaxial layer disposed on the source region; and a second epitaxial layer disposed on the drain region.

According to some embodiments, the first epitaxial layer and the second epitaxial layer comprise SiP.

According to some embodiments, the first conductivity type is P type and the second conductivity type is N type.

According to some embodiments, the semiconductor substrate is a silicon substrate, the first well of the first conductivity type is P well, the second well of the second conductivity type is N well, the source region of the second conductivity type is $N^+$ doped region, and the drain region of the second conductivity type is $N^+$ doped region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

The invention discloses an improved fin field effect transistor laterally diffused metal oxide semiconductor (FinFET LDMOS) device, which has an extra semiconductor body (ESB) and a single diffusion break (SDB) structure, which can improve the performance of high-voltage devices during high-voltage operation.

Figure 1:
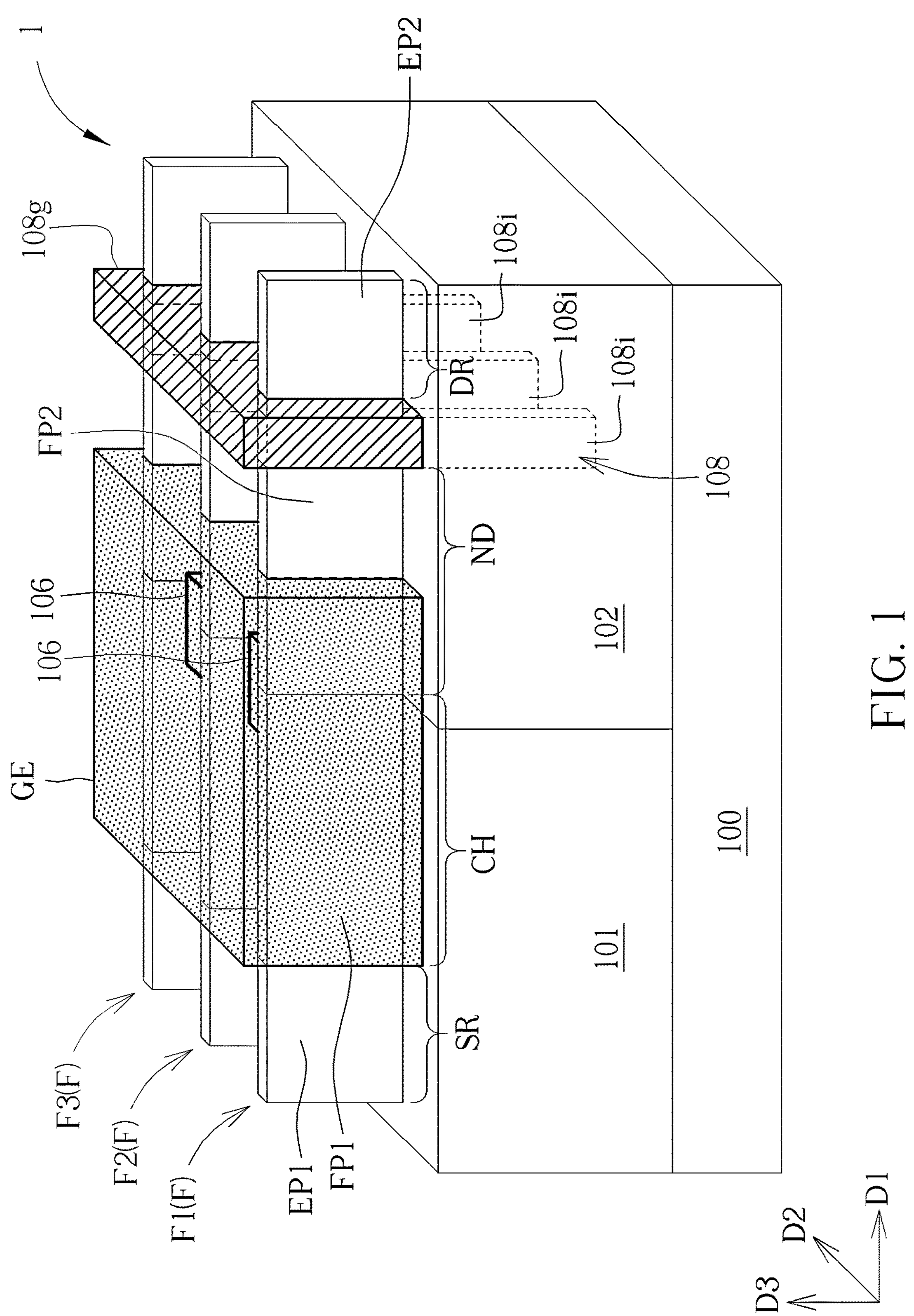
FIG. 1 is a three-dimensional perspective view of a FinFET LDMOS device according to an embodiment of the present invention.

Please refer to FIG. 1, which is a three-dimensional perspective view of a FinFET LDMOS device according to an embodiment of the present invention. As shown in FIG. 1, the FinFET LDMOS device 1 includes a semiconductor substrate 100 having a first conductivity type, for example, a silicon substrate of a first conductivity type. According to an embodiment of the present invention, multiple semiconductor fins F, for example, semiconductor fins F1-F3, are provided on the semiconductor substrate 100, extending along the first direction D1. It should be understood that the number of fins in the figure is only for illustration purposes. In other embodiments, there may be 4 or more fins. According to an embodiment of the present invention, the width of the semiconductor fin F in the second direction D2 is, for example, about 10 nm, but is not limited thereto. According to an embodiment of the present invention, the fin height of the semiconductor fin F in the third direction D3 is, for example, about 44 nm, but is not limited thereto.

According to an embodiment of the present invention, trench isolation structures (not shown) may be provided between the multiple semiconductor fins F for device isolation. The above-mentioned trench isolation structure is a common structure in FinFET devices, and is omitted from the figure for the sake of simplicity. According to an embodiment of the present invention, the multiple semiconductor fins F protrude from the top surface of the trench isolation structure along the third direction D3.

According to an embodiment of the present invention, a first well 101 of the first conductivity type and a second well 102 of a second conductivity type that is juxtaposed with the first well 101 are disposed in the semiconductor substrate 100. According to an embodiment of the present invention, the first conductivity type is, for example, P type, and the second conductivity type, for example, is N type. According to an embodiment of the present invention, for example, the semiconductor substrate 100 of the first conductivity type may be a P-type silicon substrate, the first well 101 of the first conductivity type may be a P-type well, and the second well 102 of the second conductivity type may be an N-type well. According to an embodiment of the invention, the first well 101 is contiguous with the second well 102.

According to an embodiment of the present invention, each semiconductor fin F includes a first fin portion FP1 located in the first well 101 of the first conductivity type and a second fin portion FP2 located in the second well 102 of the second conductivity type. According to an embodiment of the invention, the first fin portion FP1 is contiguous with the second fin portion FP2.

According to an embodiment of the present invention, the FinFET LDMOS device 1 further includes an extra semiconductor body (ESB) 106 located between the semiconductor fins F and contiguous with the semiconductor fins F. The strip-shaped extra semiconductor body 106 extends along a second direction D2 orthogonal to the first direction D1. According to an embodiment of the invention, the extra semiconductor body 106 is in direct contact with the first fin portion FP1 and the second fin portion FP2. According to an embodiment of the present invention, the top surface of the extra semiconductor body 106 is lower than the top surface of the semiconductor fin F. When the device is turned on, the extra semiconductor body 106 can help collect additional charges and improve the performance of the device.

According to an embodiment of the present invention, the FinFET LDMOS device 1 further includes a source region SR of the second conductivity type located in the first fin portion FP1 and a drain region DR of the second conductivity type located in the second fin portion FP2. According to an embodiment of the present invention, for example, the source region SR of the second conductivity type is an N' doped region, and the drain region DR of the second conductivity type is an N doped region.

According to an embodiment of the present invention, the FinFET LDMOS device 1 further includes a gate GE covering the semiconductor fins F and extending along the second direction D2. According to an embodiment of the present invention, the gate GE partially overlaps with the first fin portion FP1 and partially overlaps with the second fin portion FP2. According to an embodiment of the present invention, the extra semiconductor body 106 is completely covered by the gate GE. In other words, when viewed from above, the gate GE completely overlaps the extra semiconductor body 106.

According to an embodiment of the present invention, the FinFET LDMOS device 1 further includes a single diffusion break (SDB) structure 108 embedded in the second fin portion FP2. According to an embodiment of the present invention, the single diffusion break structure 108 is located between the gate GE and the drain region DR. According to an embodiment of the present invention, the single diffusion break structure 108 is contiguous with the drain region DR.

According to an embodiment of the present invention, the single diffusion break structure 108 includes a bottom insulating layer 108*i* and a top dummy gate 108*g* disposed directly on the bottom insulating layer 108*i*. According to an embodiment of the present invention, the distance from the top surface of the bottom insulating layer 108*i* of the single diffusion break structure 108 to its bottom is, for example, about 100 nm, but is not limited thereto. According to an embodiment of the present invention, the top dummy gate 108*g* is spaced apart from the gate GE. According to an embodiment of the present invention, the top dummy gate 108*g* extends along the second direction D2. According to an embodiment of the present invention, the bottom insulating layer 108*i* includes silicon oxide, for example. According to an embodiment of the present invention, the top dummy gate 108*g* and the gate GE are, for example, metal gates.

According to an embodiment of the present invention, the first fin portion FP1 includes a channel region CH located between the source region SR and the single diffusion break structure 108. According to an embodiment of the present invention, the channel region CH is disposed directly under the gate GE. According to an embodiment of the present invention, the second fin portion FP2 includes a drift region ND in the second well 102 of the second conductivity type between the channel region CH and the single diffusion break structure 108. According to an embodiment of the present invention, the gate GE partially overlaps the drift region ND.

According to an embodiment of the present invention, the FinFET LDMOS device 1 further includes a first epitaxial layer EP1 disposed on the source region SR. According to an embodiment of the present invention, the FinFET LDMOS device 1 further includes a second epitaxial layer EP2 disposed on the drain region DR. According to an embodiment of the present invention, for example, the first epitaxial layer EP1 and the second epitaxial layer EP2 include, for example, a SiP epitaxial layer.

Figure 2:
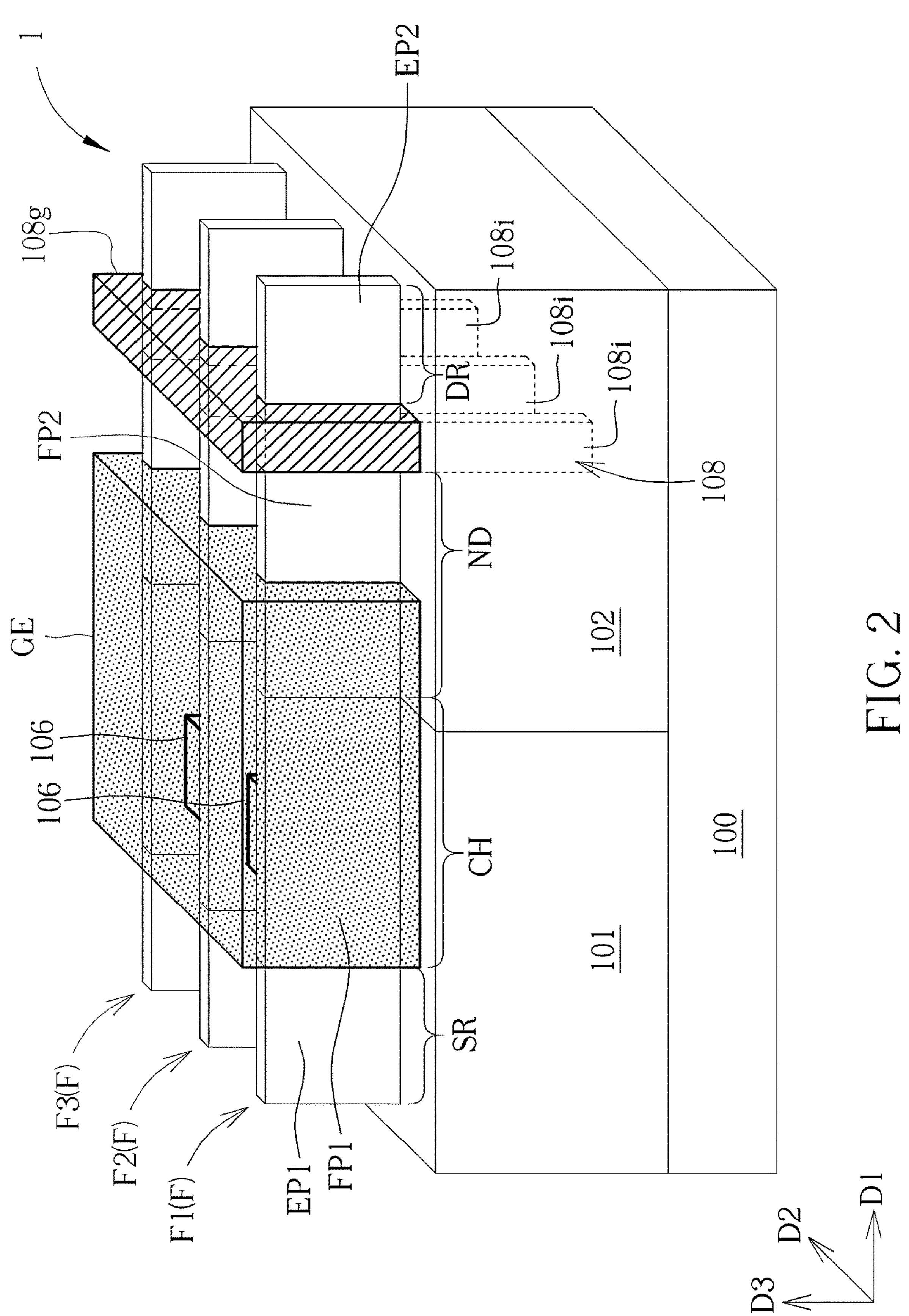
FIG. 2 is a three-dimensional perspective view of a FinFET LDMOS device according to another embodiment of the present invention.

Please refer to FIG. 2, which is a three-dimensional perspective view of a FinFET LDMOS device according to another embodiment of the present invention. As shown in FIG. 2, the FinFET LDMOS device 2 further includes a semiconductor substrate 100 having a first conductivity type, for example, a silicon substrate of a first conductivity type. According to an embodiment of the present invention, multiple semiconductor fins F, for example, semiconductor fins F1-F3, are provided on the semiconductor substrate 100, extending along the first direction D1. According to an embodiment of the present invention, trench isolation structures (not shown) may be provided between the multiple semiconductor fins F for device isolation. The above-mentioned trench isolation structure is a common structure in FinFET devices, and is omitted from the figure for the sake of simplicity. According to an embodiment of the present invention, the multiple semiconductor fins F protrude from the top surface of the trench isolation structure along the third direction D3.

According to an embodiment of the present invention, the semiconductor substrate 100 is further provided with juxtaposed first well 101 of the first conductivity type and second well 102 of a second conductivity type. According to an embodiment of the present invention, the first conductivity type is, for example, P type, and the second conductivity type, for example, is N type. According to an embodiment of the present invention, for example, the semiconductor substrate 100 of the first conductivity type may be a P-type silicon substrate, the first well 101 of the first conductivity type may be a P-type well, and the second well 102 of the second conductivity type may be an N-type well. According to an embodiment of the invention, the first well 101 is contiguous with the second well 102.

According to an embodiment of the present invention, each semiconductor fin F further includes a first fin portion FP1 located in the first well 101 of the first conductivity type and a second fin portion FP2 located in the second well 102 of the second conductivity type. According to an embodiment of the invention, the first fin portion FP1 is contiguous with the second fin portion FP2.

According to an embodiment of the present invention, the FinFET LDMOS device 2 further includes an extra semiconductor body (ESB) 106 located between the semiconductor fins F and contiguous with the semiconductor fins F. The strip-shaped extra semiconductor body 106 extends along the second direction D2 orthogonal to the first direction D1. According to an embodiment of the present invention, the extra semiconductor body 106 only directly contacts the first fin portion FP1 and does not directly contact the second fin portion FP2. According to an embodiment of the present invention, the top surface of the extra semiconductor body 106 is lower than the top surface of the semiconductor fins F.

According to an embodiment of the present invention, the FinFET LDMOS device 2 further includes a source region SR of the second conductivity type located in the first fin portion FP1 and a drain region DR of the second conductivity type located in the second fin portion FP2. According to an embodiment of the present invention, for example, the source region SR of the second conductivity type is an N doped region, and the drain region DR of the second conductivity type is an N doped region.

According to an embodiment of the present invention, the FinFET LDMOS device 2 further includes a gate GE covering the semiconductor fins F and extending along the second direction D2. According to an embodiment of the present invention, the gate GE partially overlaps with the first fin portion FP1 and partially overlaps with the second fin portion FP2. According to an embodiment of the present invention, the extra semiconductor body 106 is completely covered by the gate GE. In other words, when viewed from above, the gate GE completely overlaps the extra semiconductor body 106.

According to an embodiment of the present invention, the FinFET LDMOS device 2 further includes a single diffusion break (SDB) structure 108 embedded in the second fin portion FP2. According to an embodiment of the present invention, the single diffusion break structure 108 is located between the gate GE and the drain region DR. According to an embodiment of the present invention, the single diffusion break structure 108 is contiguous with the drain region DR.

According to an embodiment of the present invention, the single diffusion break structure 108 includes a bottom insulating layer 108*i* and a top dummy gate 108*g* directly disposed on the bottom insulating layer 108*i*. According to an embodiment of the present invention, the top dummy gate

108*g* is spaced apart from the gate GE. According to an embodiment of the present invention, the top dummy gate 108*g* extends along the second direction D2. According to an embodiment of the present invention, the bottom insulating layer 108*i* includes silicon oxide, for example. According to an embodiment of the present invention, the top dummy gate 108*g* and the gate GE are, for example, metal gates.

According to an embodiment of the present invention, the first fin portion FP1 includes a channel region CH located between the source region SR and the single diffusion break structure 108. According to an embodiment of the present invention, the channel region CH is disposed directly under the gate GE. According to an embodiment of the present invention, the second fin portion FP2 includes a drift region ND in the second well 102 of the second conductivity type between the channel region CH and the single diffusion break structure 108. According to an embodiment of the present invention, the gate GE partially overlaps the drift region ND.

According to an embodiment of the present invention, the FinFET LDMOS device 2 further includes a first epitaxial layer EP1 disposed on the source region SR. According to an embodiment of the present invention, the FinFET LDMOS device 2 further includes a second epitaxial layer EP2 disposed on the drain region DR. According to an embodiment of the present invention, for example, the first epitaxial layer EP1 and the second epitaxial layer EP2 include, for example, a SiP epitaxial layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fin field-effect transistor (FinFET) laterally diffused metal-oxide-semiconductor (LDMOS) device, comprising:
- a semiconductor substrate of a first conductivity type;
- a first well of the first conductivity type in the semiconductor substrate;
- a second well of a second conductivity type, juxtaposed with the first well of the first conductivity, in the semiconductor substrate;
- a semiconductor fin disposed on the semiconductor substrate and extending along a first direction, wherein the semiconductor fin comprises a first fin portion within the first well of the first conductivity type and a second fin portion within the second well of the second conductivity type;
- an extra semiconductor body adjoining the semiconductor fin and extending along a second direction orthogonal to the first direction, wherein the extra semiconductor body is in direct contact with the first fin portion and the second fin portion;
- a source region of the second conductivity type in the first fin portion;
- a drain region of the second conductivity type in the second fin portion;
- a gate overlying the semiconductor fin and extending along the second direction, wherein the gate partially overlaps with the first fin portion and partially overlaps with the second fin portion, wherein the extra semiconductor body is covered by the gate;
- a single-diffusion break (SDB) structure embedded in the second fin portion and positioned between the gate and the drain region;
- wherein the first fin portion comprises a channel region between the source region and the SDB structure, wherein the channel region is disposed directly under the gate;
- wherein the second fin portion comprises a drift region in the second well of the second conductivity type between the channel region and the SDB structure, wherein the gate partially overlaps with the drift region; and
- wherein the SDB structure comprises a bottom insulating layer and a top dummy gate disposed directly on the bottom insulating layer, wherein the top dummy gate is spaced apart from the gate.

2. The FinFET LDMOS device according to claim 1, wherein the top dummy gate extends along the second direction, wherein the bottom insulating layer comprises silicon oxide, and wherein the top dummy gate and the gate are metal gates.

3. The FinFET LDMOS device according to claim 1, wherein the SDB structure is contiguous with the drain region.

4. The FinFET LDMOS device according to claim 1, wherein a top surface of the extra semiconductor body is lower than a top surface of the semiconductor fin.

5. The FinFET LDMOS device according to claim 1 further comprising:
- a first epitaxial layer disposed on the source region; and
- a second epitaxial layer disposed on the drain region.

6. The FinFET LDMOS device according to claim 5, wherein the first epitaxial layer and the second epitaxial layer comprise SiP.

7. The FinFET LDMOS device according to claim 1, wherein the first conductivity type is P type and the second conductivity type is N type.

8. The FinFET LDMOS device according to claim 1, wherein the semiconductor substrate is a silicon substrate, the first well of the first conductivity type is P well, the second well of the second conductivity type is N well, the source region of the second conductivity type is $N^+$ doped region, and the drain region of the second conductivity type is $N^+$ doped region.

9. A fin field-effect transistor (FinFET) laterally diffused metal-oxide-semiconductor (LDMOS) device, comprising:
- a semiconductor substrate of a first conductivity type;
- a first well of the first conductivity type in the semiconductor substrate;
- a second well of a second conductivity type, juxtaposed with the first well of the first conductivity, in the semiconductor substrate;
- a semiconductor fin disposed on the semiconductor substrate and extending along a first direction, wherein the semiconductor fin comprises a first fin portion within the first well of the first conductivity type and a second fin portion within the second well of the second conductivity type;
- an extra semiconductor body adjoining the semiconductor fin and extending along a second direction orthogonal to the first direction, wherein the extra semiconductor body is in direct contact only with the first fin portion and does not directly contact the second fin portion;
- a source region of the second conductivity type in the first fin portion;
- a drain region of the second conductivity type in the second fin portion;
- a gate overlying the semiconductor fin and extending along the second direction, wherein the gate partially overlaps with the first fin portion and partially overlaps with the second fin portion, wherein the extra semiconductor body is covered by the gate; and a single-diffusion break (SDB) structure embedded in the second fin portion and positioned between the gate and the drain region;

wherein the first fin portion comprises a channel region between the source region and the SDB structure, wherein the channel region is disposed directly under the gate;

wherein the second fin portion comprises a drift region in the second well of the second conductivity type between the channel region and the SDB structure, wherein the gate partially overlaps with the drift region; and wherein the SDB structure comprises a bottom insulating layer and a top dummy gate disposed directly on the bottom insulating layer, wherein the top dummy gate is spaced apart from the gate.

10. The FinFET LDMOS device according to claim 9, wherein the top dummy gate extends along the second direction, wherein the bottom insulating layer comprises silicon oxide, and wherein the top dummy gate and the gate are metal gates.

11. The FinFET LDMOS device according to claim 9, wherein the SDB structure is contiguous with the drain region.

12. The FinFET LDMOS device according to claim 9, wherein a top surface of the extra semiconductor body is lower than a top surface of the semiconductor fin.

13. The FinFET LDMOS device according to claim 9 further comprising:

a first epitaxial layer disposed on the source region; and a second epitaxial layer disposed on the drain region.

14. The FinFET LDMOS device according to claim 13, wherein the first epitaxial layer and the second epitaxial layer comprise SiP.

15. The FinFET LDMOS device according to claim 9, wherein the first conductivity type is P type and the second conductivity type is N type.

16. The FinFET LDMOS device according to claim 9, wherein the semiconductor substrate is a silicon substrate, the first well of the first conductivity type is P well, the second well of the second conductivity type is N well, the source region of the second conductivity type is $N^+$ doped region, and the drain region of the second conductivity type is $N^+$ doped region.

* * * * *